United States Patent
Menzel et al.

(10) Patent No.: US 6,853,115 B2
(45) Date of Patent: Feb. 8, 2005

(54) ACOUSTIC SURFACE WAVE COMPONENT

(75) Inventors: Siegfried Menzel, Dresden (DE); Hagen Schmidt, Leipzig (DE); Manfred Weihnacht, Malter (DE)

(73) Assignee: Leibniz-Institut fuer Festkoerper-und Werkstoffforschung Dresden e.V., Dresden (DE)

( * ) Notice: Subject to any disclaimer, the term of this patent is extended or adjusted under 35 U.S.C. 154(b) by 0 days.

(21) Appl. No.: 10/432,683

(22) PCT Filed: Feb. 15, 2002

(86) PCT No.: PCT/DE02/00571

§ 371 (c)(1), (2), (4) Date: Oct. 2, 2003

(87) PCT Pub. No.: WO02/067423

PCT Pub. Date: Aug. 29, 2002

(65) Prior Publication Data

US 2004/0076081 A1 Apr. 22, 2004

(30) Foreign Application Priority Data

Feb. 16, 2001 (DE) .......................... 101 07 804

(51) Int. Cl.[7] .............................. H01L 41/08

(52) U.S. Cl. .................................. 310/364; 310/313 A
(58) Field of Search ........................ 310/313 A, 313 B, 310/313 R, 363, 364

(56) References Cited

U.S. PATENT DOCUMENTS

| | | | | |
|---|---|---|---|---|
| 5,497,726 A | * | 3/1996 | Shikata et al. | ................ 117/89 |
| 5,844,347 A | * | 12/1998 | Takayama et al. | ...... 310/313 R |
| 5,856,198 A | * | 1/1999 | Joffe et al. | ................... 436/100 |
| 6,297,580 B1 | * | 10/2001 | Takayama et al. | .......... 310/364 |
| 6,580,198 B2 | * | 6/2003 | Nakano et al. | ......... 310/313 R |

\* cited by examiner

*Primary Examiner*—Mark Budd
(74) *Attorney, Agent, or Firm*—Jordan and Hamburg LLP

(57) ABSTRACT

An acoustic surface wave component for which metallic strip structures of copper are applied on a piezoelectric material wherein the metallic strip structures have a polycrystalline and/or monocrystalline structure and/or are present in an amorphous state and consist of a basic copper material to which 0 atom percent to a maximum of 10 atom percent of one or more other metallic elements, an alloy and/or a compound are mixed, and that the strip structures are coated with or surround by one or more diffusion barrier layers.

17 Claims, 2 Drawing Sheets

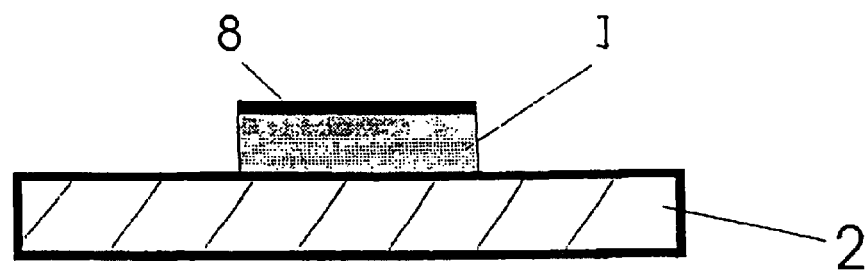
Fig. 1)
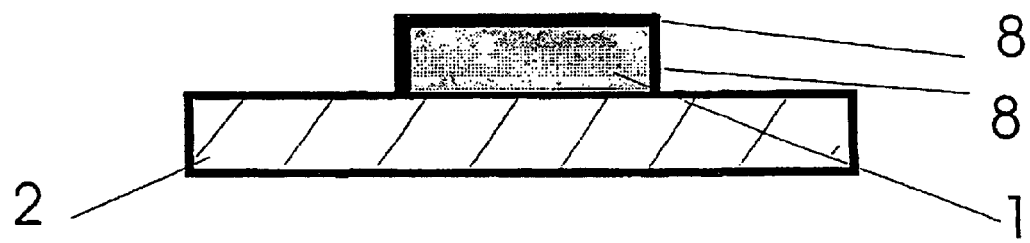
Fig. 2)
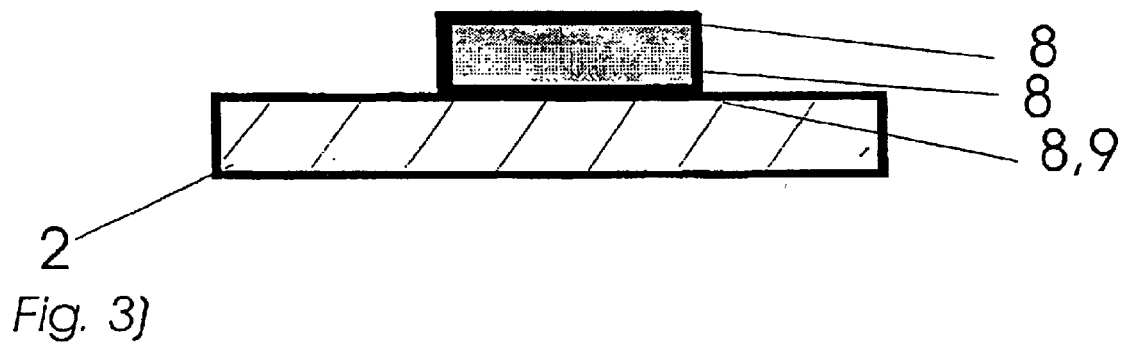
Fig. 3)
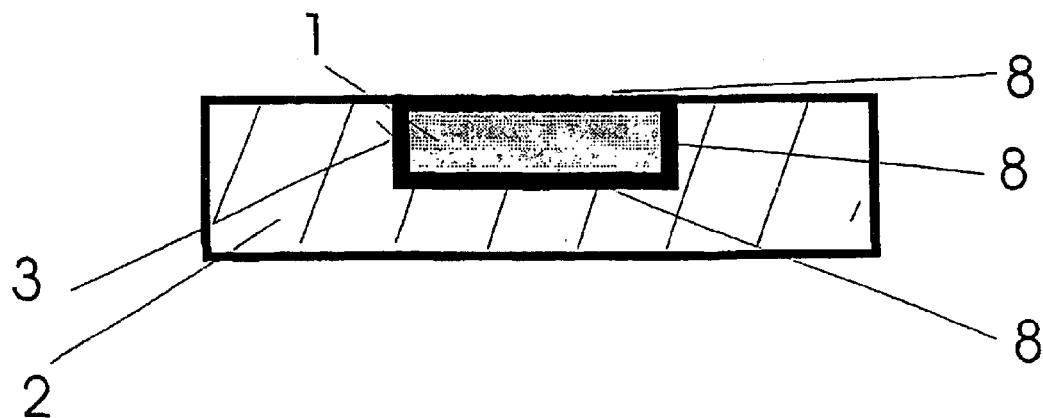
Fig. 4)

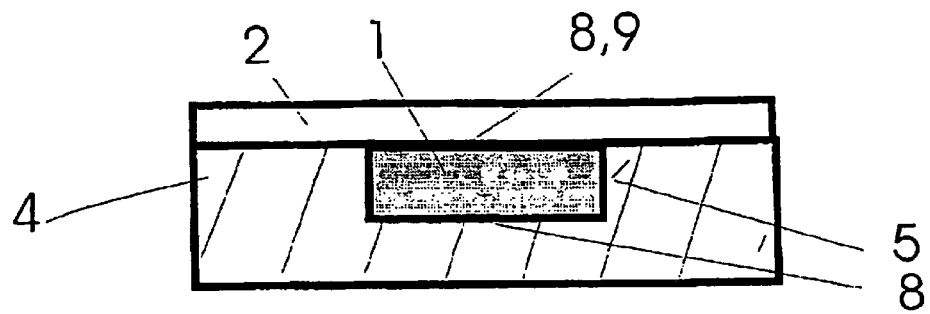
Fig. 5)
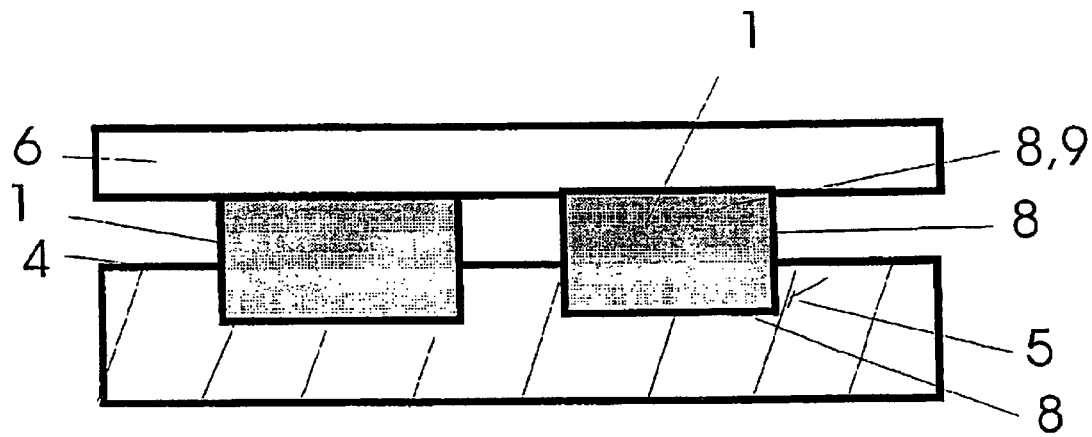
Fig. 6)
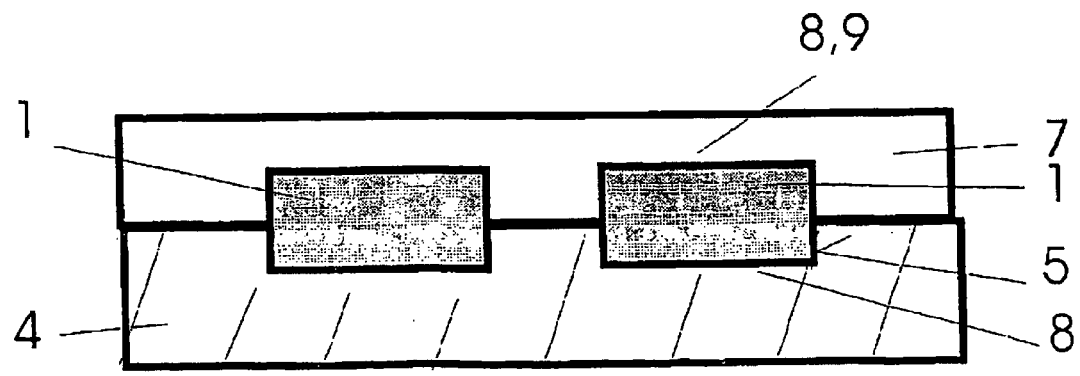
Fig. 7)

ACOUSTIC SURFACE WAVE COMPONENT

BACKGROUND OF THE INVENTION

The invention relates to an acoustic surface wave component, for which the metallic strip structures are coupled mechanically with a piezoelectric material. Such components can be used, for example, as filters, acoustooptical modulators, actors, convolvers or sensors.

The strip structures of known acoustic surface wave component are based on aluminum and are subject to acoustomigration under load, especially when high performances and amplitudes are realized. At the same time, the material of the strip structures is transported partially. This leads to the formation of cavities and strip interruption, on the one hand, and to hill growth and lateral excrescences on the other. The partial delamination of the strip structures can represent further characteristics of damage. These changes bring about an impairment of the function of the component, such as a displacement of the filter frequency when filtering or of the whole filter characteristics with respect to admittance and insertion attenuation, up to the total failure of the component.

Various technical solutions are already known for decreasing acoustomigration. One of the solutions consists of the use of highly textured or monocrystalline aluminum layers for producing the strip structures. However, such a procedure has the disadvantage that it is very expensive to manufacture strip structures.

A different procedure consists of using two-layer aluminum layers, the aluminum being alloyed with small amounts of a different element, especially with copper or titanium, layers with alloys of different composition being combined (U.S. Pat. No. 4,775,814).

Multi-layer systems with up to eleven aluminum layers are also known, in each case an aluminum-free intermediate layer of, for example, titanium or copper, being disposed as a migration inhibitor with a larger elastic component between the individual aluminum layers, which represent the main components of the layer system (U.S. Pat. No. 5,844,374). Technically, it is very expensive to produce strip structures on this basis.

In the case of leaky mode components, it is known that the aluminum strip structures may be provided with a hard covering layer, such as a layer of aluminum oxide, silicide or boride (DE 197 58 195). The layer is either applied or produced by reaction with the aluminum. However, the substrate, as well as the thickness of the coating and of the metallizing must be adapted to the wave type, so that only a slight attenuation of the surface waves is brought about.

An acoustic surface wave arrangement is also known, for which monocrystalline copper layers, grown on a diamond substrate, are used to decrease migration effects (DE 693 07 974 T2). However, the technical effort and the costs for a technological transformation of these monocrystalline layer systems are very high. It is probably hardly possible to realize this technique industrially with the required reproducibility and cost effectiveness. Moreover, it is generally difficult to produce monocrystalline copper, since, according to the present state of knowledge, a very small lattice mismatching is required between layer and substrate and, with that, this technique cannot be employed without a buffer layer for the most frequently used piezoelectric substrate materials, such as $LiNbO_3$, $LiTaO_3$ or quartz.

SUMMARY OF THE INVENTION

It is an object of the invention to develop acoustic surface wave components, for which metallic strip structures of copper are coupled mechanically with a piezoelectric material in such a manner that, even at a high load on the components, the acoustomigration at the strip structures can be reduced noticeably or avoided completely with technical measures, which are easily realized.

Pursuant to the invention, this objective is accomplished owing to the fact that the metallic strip structures have a polycrystalline and/or nanocrystalline structure and/or are present in the amorphous state and consist of a basic copper material, which is mixed with 0 atom percent to a maximum of 10 atom percent of one or more other metallic elements, an alloy and/or a compound. In addition, the strip structures are coated or surrounded, pursuant to the invention, with one or more diffusion barrier layers.

According to advantageous developments of the invention, a coupling agent layer and/or a protective layer is present on the diffusion barrier layers or the diffusion barrier layers are constructed as a protective layer and/or as a coupling agent layer.

The elements mixed in are selected preferably from the group comprising Ag, Ta, W, Si, Zr, Cr and Ti.

According to an advantageous development of the invention, the strip structures consist of a basic copper alloy with 50 atom ppm up to 5.0 atom percent of silver and preferably with 100 atom ppm up to 2.0 atom percent of silver.

The alloy mixed in may advantageously consist of two or more elements of the group comprising Ag, Ta, W, Si, Zr, Cr and Ti.

The strip structures advantageously may be coated or surrounded with $SiO_2$, $Si_3N_4$, $CrO_2$, and/or $Al_2O_3$.

The inventive strip structures may rest on the piezoelectric material or be embedded completely or partly with respect to the strip height in grooves of the piezoelectric material.

Pursuant to the invention, the strip structures can also rest on a non-piezoelectric substrate or be embedded completely or partly with respect to the strip height in grooves of a non-piezoelectric substrate. The partly or completely embedded strip structures are either connected at their upper side with a piezoelectric plate or covered at their upper side and partly at their side surfaces with a piezoelectric layer.

The non-piezoelectric substrate may consist here of an insulating material or of a semiconductor material, particularly of diamond, Si, GaAs or Ge or compounds of Si or Ge.

The strip structures may be constructed as a monolayer or as a multilayer, adjacent layers of the multilayer possibly consisting of different materials.

Advantageously, a diffusion barrier layer and/or a coupling agent layer may be disposed between the strip structures and the non-piezoelectric substrate and/or between the layers of the multilayer and/or between the strip structures and the piezoelectric material.

The diffusion barrier layer preferably consists of Ta, Ti, W, Ag, Au, Al or their oxides, nitrides or fluorides or of multilayers of these materials.

Cr, Ti, W, Ta, Si or their compounds are provided as coupling agents.

If the strip structures are produced with a polycrystalline structure, the particle size should predominantly be less than 50 nm.

For accomplishing the object of the invention, provisions are also made so that the strip structures consist of a basic copper alloy of the composition $Cu_{(100-x)}Ag_x$, x being adjusted to a value ranging from 59 to 62 and especially to a value of 60.1, which corresponds to the eutectic point of the alloy.

Compared to known such components, the inventive, acoustic surface wave components have a clearly higher resistance to acoustomigration and, with that, a longer service life, since the acoustomigration at the strip structures is decreased significantly, and, in certain cases, avoided practically completely. This advantage is achieved particularly by the material used for the strip structures, but also by the manner in which the strip structures are coupled mechanically with the piezoelectric material and its covering, which are formed by the barrier layers and/or protective layers that are provided pursuant to the invention. In the case of acoustic surface wave components, the invention can be employed advantageously for all metallic strip structures used there, especially for converter structures and reflector strips.

In the following, the invention is explained in greater detail by means of examples and as shown in the accompanying drawings. Only the part of the inventive components, essential for explaining the invention are shown in the Figures.

BRIEF DESCRIPTION OF THE DRAWINGS

FIGS. 1 to 3 each show a strip which has been deposited on a piezoelectric material.

FIG. 4 shows a strip within a groove in a piezoelectric material.

FIG. 5 shows a strip in a groove in a non-piezoelectric substrate.

FIG. 6 shows a Strip connected at their upside with a plate piezoelectric material.

FIG. 7 shows surfaces of the strip protruding from a non-piezoelectric substrate.

DESCRIPTION OF THE PREFERRED EMBODIMENTS

In FIGS. 1 to 3, one of the strips 1 of a strip structure can be seen, which has been deposited on a piezoelectric material 2. The strip structure consists of copper with an addition of 1.0 atom percent of silver. The piezoelectric material may consist, for example, of monocrystalline $LiNbO_3$, $LiTO_3$, $SiO_2$, $La_3Ga_5SiO_{14}$, $Li_2B_4O_7$, $GaPO_4$, ZnO or AlN. The upper side of the strip 1 and, in FIGS. 2 and 3, also the side edges of strip 1 are covered with a diffusion barrier layer 8 of TaN which, in particular, prevents the diffusion of oxygen and copper. For the arrangement of FIG. 3, a coupling agent 9 of Ta, which functions, at the same time, also as a diffusion barrier 8, is also present between the strip 1 and the piezoelectric material 2. For the representation of FIG. 4, the strip 1 is embedded in the grooves 3, which are incorporated in the piezoelectric material 2, and surrounded on all sides with a diffusion barrier 8.

For the arrangement of FIG. 5, the strip 1 is in a groove 5, incorporated in a non-piezoelectric substrate 4. The strip 1 is connected at its upper side with the piezoelectric material 2. For the arrangements of FIGS. 6 and 7, two strips 1 of a strip structure are shown in each case. With respect to their height, the strips 1 are embedded only partly here in the groove 5, which is incorporated in a non-piezoelectric substrate 4. For the arrangement of FIG. 6, the strips 1 are connected at their upper side with a plate 6 of piezoelectric material 2. For the arrangement of FIG. 7, the surfaces of the strip 1, protruding from the non-piezoelectric substrate, are coated with a layer 7 of a piezoelectric material 2.

For the arrangements of FIGS. 5 to 7, the non-piezoelectric substrate 4 consists of a semiconductor material and, moreover, of silicon. In other respects, the same materials, mentioned in connection with FIGS. 1 to 4, were used.

The copper, diffusion barrier, coupling agent and protective layers advisably are applied by the known methods of thin-layer technology, for example, by magnetron spattering and also by MO-CVD, by electron beam evaporation or by electroplating.

The inventive strip structures can be applied on any commercial piezoelectric or non-piezoelectric substrate and rest on the strip structure or be embedded partly or completely in grooves on the strip structure. Moreover, structuring methods known from microelectronics, such as the lift-off technique or etching, can be used.

What is claimed is:

1. An acoustic surface wave component, for which metallic strip structures of copper are applied on a piezoelectric material, wherein the metallic strip structures have a polycrystalline and/or monocrystalline structure and/or are present in an amorphous state and comprises a basic copper material, to which 0 atom percent to a maximum of 10 atom percent of one or more other metallic elements, an alloy and/or a compound are mixed, and that the strip structures are coated with or surrounded by one or more diffusion barrier layers.

2. The acoustic surface wave component of claim 1, wherein a coupling agent layer and/or a protective layer is present on the diffusion barrier layers.

3. The acoustic surface wave component of claim 1, wherein the diffusion barrier layers are constructed as a protective layer and/or as a coupling agent layer.

4. The acoustic surface wave component of claim 1, wherein the admixed elements are selected from the group comprising Ag Ta, W, Si, Zr, Cr and Ti.

5. The acoustic surface wave component of claim 1, wherein the strip structures comprises a basic copper alloy with 50 atom ppm up to 5.0 atom percent and preferably of 100 atom ppm up to 2.0 atom percent of silver.

6. The acoustic surface wave component of claim 1, wherein the admixed alloy comprises two or more elements of the group comprising Ag, Ta, W, Si, Zr, Cr and Ti.

7. The acoustic surface wave component of claim 1, wherein the strip structures are coated or surrounded with $SiO_2$, $Si_3N_4$, $CrO_2$ and/or $Al_2O_3$.

8. The acoustic surface wave component of claim 1, wherein the strip structures rest on the piezoelectric material or are embedded completely or partly with respect to the strip height in grooves of the piezoelectric material.

9. The acoustic surface wave component of claim 1, wherein the strip structures rest on a non-piezoelectric substrate or are embedded completely or partly with respect to the strip height in grooves of a non-piezoelectric substrate, the partly or completely embedded strip structures either being connected at their upper side with a piezoelectric plate or covered at their upper side and partly at their side surfaces with a piezoelectric layer.

10. The acoustic surface wave component of claim 9, wherein the non-piezoelectric substrate comprises an insulating material or of a semiconductor material, especially of diamond, Si, GaAs or Ge or compounds of Si or Ge.

11. The acoustic surface wave component of claim 1, wherein the strip structures are formed as a monolayer or as a multilayer.

12. The acoustic surface wave component of claim 11, wherein the adjacent layers in the multilayer comprises different materials.

13. The acoustic surface wave component of one of the claims 1 to 12, wherein a diffusion barrier layer and/or a coupling agent layer is disposed between the strip structures and the non-piezoelectric substrate and/or between the layers of the multilayer and/or between the strip structures and the piezoelectric material.

14. The acoustic surface wave component of one of claims 1 to 12, wherein a diffusion barrier layer and/or a coupling agent layer is disposed between the strip structures and the non-piezoetectric substrate and/or between the layers of the multilayer and/or between the strip structures and the piezoelectric material, said diffusion barrier layer comprising Ta, Ti, W, Ag, Au, Al or their oxides or nitrides or fluorides or of multilayers of these materials.

15. The acoustic surface wave component of one of claims 1 to 12, wherein a diffusion barrier layer and/or a coupling agent layer is disposed between the strip structures and the non-piezoelectric substrate and/or between the layers of the multilayer and/or between the strip structures and the piezoelectric material, said coupling agent layer comprising Cr, Ti, W, Ta, Si or their compounds.

16. The acoustic surface wave component of claim 1, wherein when the strip structures are constructed with a nanocrystalline structure, the particle sizes predominantly are less than 50 nm.

17. The acoustic surface wave component of one of the claims 1 to 12, wherein the strip structures comprise a basic copper alloy having the composition $Cu_{(100-x)}Ag_x$, x being adjusted to a value ranging from 59 to 62 and especially to a value of 60.1, which is the eutectic point of the alloy.

* * * * *